United States Patent [19]

Reimer

[11] Patent Number: 4,538,209
[45] Date of Patent: Aug. 27, 1985

[54] DOUBLE FILE PRINTED WIRING BOARD MODULE

[75] Inventor: William A. Reimer, Wheaton, Ill.

[73] Assignee: GTE Automatic Electric Incorporated, Northlake, Ill.

[21] Appl. No.: 527,634

[22] Filed: Aug. 29, 1983

[51] Int. Cl.³ .............................................. H05K 1/14
[52] U.S. Cl. ............................. 361/395; 339/17 LM; 361/413; 361/415
[58] Field of Search ....................... 361/415, 395, 413; 211/41; 339/17 M, 17 LM

[56] References Cited

U.S. PATENT DOCUMENTS

| | | | |
|---|---|---|---|
| 3,368,115 | 2/1968 | Hoffman | 361/415 |
| 3,614,541 | 10/1971 | Farrand | 361/415 X |
| 4,099,623 | 7/1978 | Osdol | 361/415 X |
| 4,179,724 | 12/1979 | Bonhomme | 361/415 X |
| 4,327,835 | 5/1982 | Leger | 211/41 |
| 4,382,271 | 5/1983 | Villemont et al. | 361/415 X |
| 4,382,517 | 5/1983 | Welsch | 361/415 X |
| 4,426,675 | 1/1984 | Robinson et al. | 361/415 |

*Primary Examiner*—R. R. Kucia
*Attorney, Agent, or Firm*—Robert J. Black; Gregory G. Hendricks

[57] ABSTRACT

A double file printed wiring board module arranged to mount printed wiring boards on both sides of a centrally positioned interconnect or side plane while providing for the convection cooling of the printed wiring boards and the interconnection of same with conductors of minimal length. The printed wiring boards are supported by a connector at one side edge and a board guide at an opposite side edge. The interconnect or side plane includes an external termination connector mounted at its rear edge to permit the efficient connection of the circuit module to external terminations.

14 Claims, 4 Drawing Figures

DOUBLE FILE PRINTED WIRING BOARD MODULE

CROSS-REFERENCES TO RELATED APPLICATIONS

Related, commonly assigned, co-pending applications include "Printed Wiring Board File," Ser. No. 527,635, "Printed Wiring Board Interconnect Arrangement," Ser. No. 527,636, Pat. No. 4,498,717 "Low Insertion Force Connection Arrangement," Ser. No. 527,637, Pat. No. 4,504,101 "Low Insertion Force Connection Arrangement," Ser. No. 527,638, Pat. No. 4,505,527, and "Low Insertion Force Connection Arrangement," Ser. No. 527,639, Pat. No. 4,505,528 all filed concurrently herewith.

BACKGROUND OF THE INVENTION

The present invention relates to double file printed wiring board modules and, more particularly, to a double file printed wiring board module mounting printed wiring boards on both sides of an interconnect or side plane.

Double file printed wiring board modules are very well known to those skilled in the art. One type of double file printed wiring board module is described in U.S. Pat. No. 3,368,115, issued Feb. 6, 1968, to N. E. Hoffman in which is described a modular housing with improved interconnection means. Hoffman discloses a plurality of circuit boards, a pair of spaced apart circuit board connectors, and an interconnecting panel member which is wrapped around the circuit board connectors. Interconnections between different boards of the module are established by way of an edge contact on a first board which engages a feed through contact on one of the board connectors which, in turn, engages a conductor on the interconnecting panel. This conductor on the interconnecting panel extends to a second feed through contact which, in turn, engages an edge contact on a second printed wiring board.

Such an arrangement, while operating generally satisfactorily, includes circuit paths which are of inordinate length and contain several electrical connections. Electrical connections and long conductor lengths have been found to be a source of signal interference due to extraneous signal pick-up by the conductors and defects in continuity at conductor connection points. Further, the enclosed cubic construction can permit unacceptably high temperatures to exist during circuit operation.

U.S. Pat. No. 3,614,541, issued Oct. 19, 1971, to W. A. Farrand teaches construction of an electronic assembly comprising a plurality of modules having integrated circuits secured to the module boards. The module boards are interconnected, and further connected to output contacts through conducting strips formed on the interior of housing sides which support the module boards. The package is assembled by subjecting it to an environment which fuses the module output contacts to the conductive strips while simultaneously forming a hermetically sealed package. Such an arrangement, while operating generally satisfactorily, does not permit the replacement of individual module boards when a circuit failure is encountered. Additionally, the enclosed construction of the electronic assembly can permit build up of harmfully high temperatures on interior module boards.

SUMMARY OF THE INVENTION

In accordance with the present invention a double file printed wiring board module is provided. This module includes a first and a second column of printed wiring boards, each column including at least one printed wiring board, and each board including a component mounting surface, first and second edges, and a plurality of connector tabs adjacent to the first edge to provide electrical access to the board. The board in the first column is arranged parallel to the board in the second column without overlap in a direction normal to the component mounting surfaces, with the connector tab edge of the board in the first column adjacent to the connector tab edge of the board in the second column. The module also includes a pair of support plates, each support plate positioned adjacent to a different one of said board second edges, and a plurality of positioners positioning the support plates relative to each other.

At least one pair of printed wiring board guides is included in the module, each guide attached to a different one of the support plates and including at least one groove engaged with a corresponding one of the board second edges. The module further includes at least first and second interconnected connectors, each connector engaging the plurality of connector tabs of a different one of the printed wiring boards, and a side plane positioned relative to the support plates, positioned intermediate to the printed wiring boards, and mounting the connectors on at least one side thereof, the side plane via the connectors cooperating with the support plates via the board guides to support the printed wiring boards.

BRIEF DESCRIPTION OF THE DRAWING

The various features and advantages of a double file printed wiring board module in accordance with the present invention will be apparent from the following description taken in conjunction with the accompanying drawing in which.

DESCRIPTION OF THE PREFERRED EMBODIMENT

Figure 1:
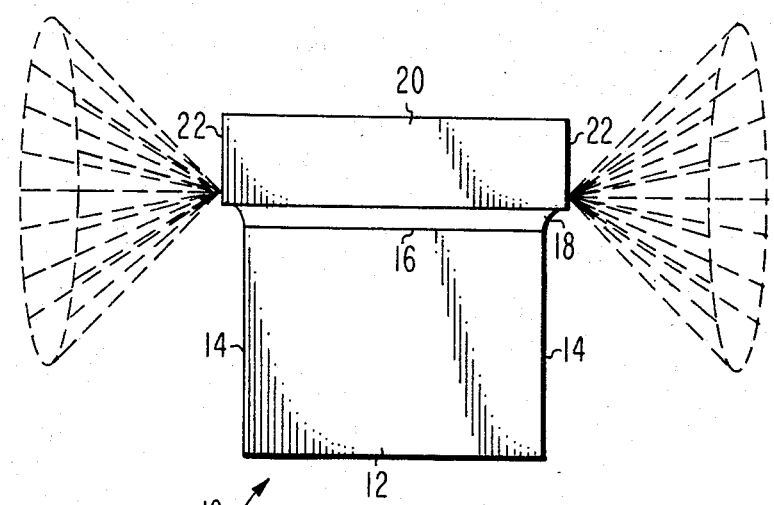
FIG. 1 is a perspective view of a double file printed wiring board module in accordance with the present invention.

Referring now to FIG. 1, there is shown a double file printed wiring board module in accordance with the present invention having a vertically oriented left stack of printed wiring boards 1 including a top mounted printed wiring board 2, a second mounted printed wiring board 3, and a vertically oriented right stack of printed wiring boards 4 including a top mounted printed wiring board 5. Each printed wiring board includes an inner edge 6, an outer edge 7, and a plurality of connector tabs 8 formed on the printed wiring boards adjacent to their inner edges 6. A left support plate 10 and a right support plate 11 are positioned adjacent to the outer edges 7 of the printed wiring boards. The support plates 10 and 11 are located parallel to each other by a plurality of positioners 12' and 12 attached at the corners of the support plates 10 and 11, respectively. A plurality of printed wiring board guides 13, each including a groove 14, are attached to the support plates 10 and 11 and engage the printed wiring board outer edges 7 via the grooves 14 to support the printed wiring boards.

Figure 2:
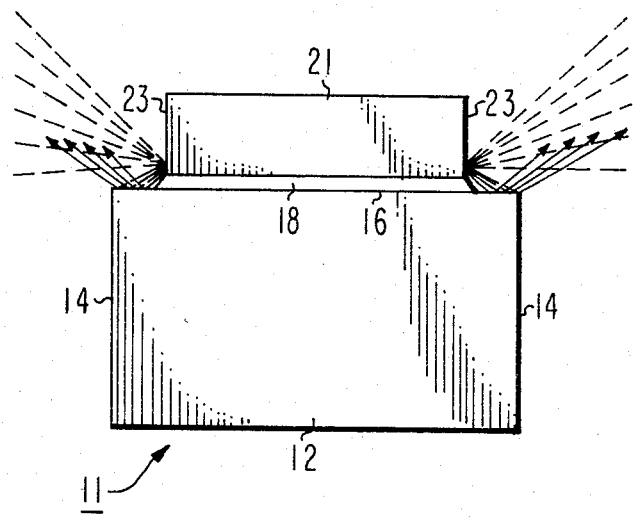
FIG. 2 is a perspective view of an alternate embodiment of the printed wiring board guide in accordance with the present invention shown in FIG. 1.

Referring to FIG. 2 there is shown an alternately embodied printed wiring board guide 15 in accordance with the present invention. The printed wiring board guide 15 is of unitary construction and includes a plurality of printed wiring board outer edge engaging grooves 16.

Figure 3:
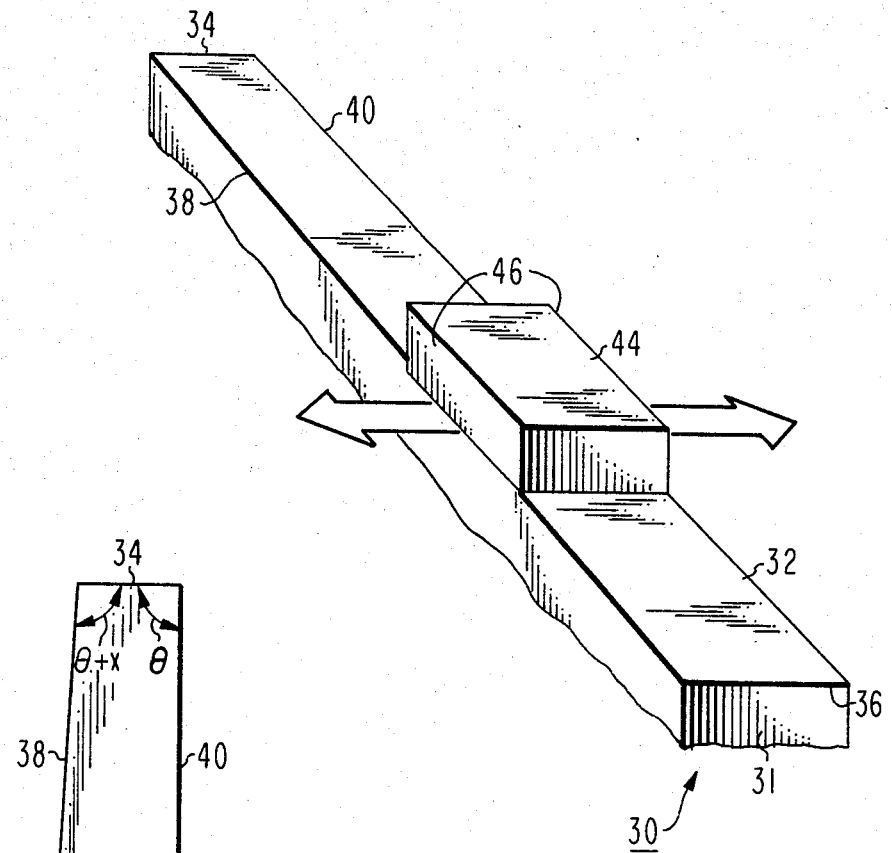
FIG. 3 is a front view of the double file printed wiring board module of the present invention.

Referring now to FIG. 3 there is shown a plurality of printed wiring board connectors including connectors 21 through 29 engaging the connector tabs 8 of the printed wiring boards. A side plane 30 is included between the connectors 21 through 29 and positions the connectors relative to each other. The side plane 30 is positioned parallel to the support plates 10 and 11 by the positioners 12 and 12' attached thereto.

Figure 4:
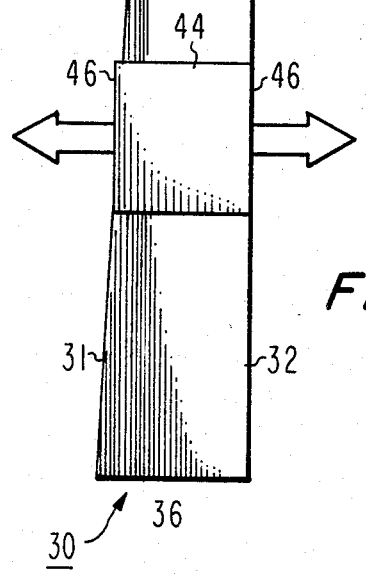
FIG. 4 is a sectional view of the double file printed wiring board module of the present invention taken along the line 4—4 of FIG. 3 showing various features and advantages of the present invention.
Figure 5:
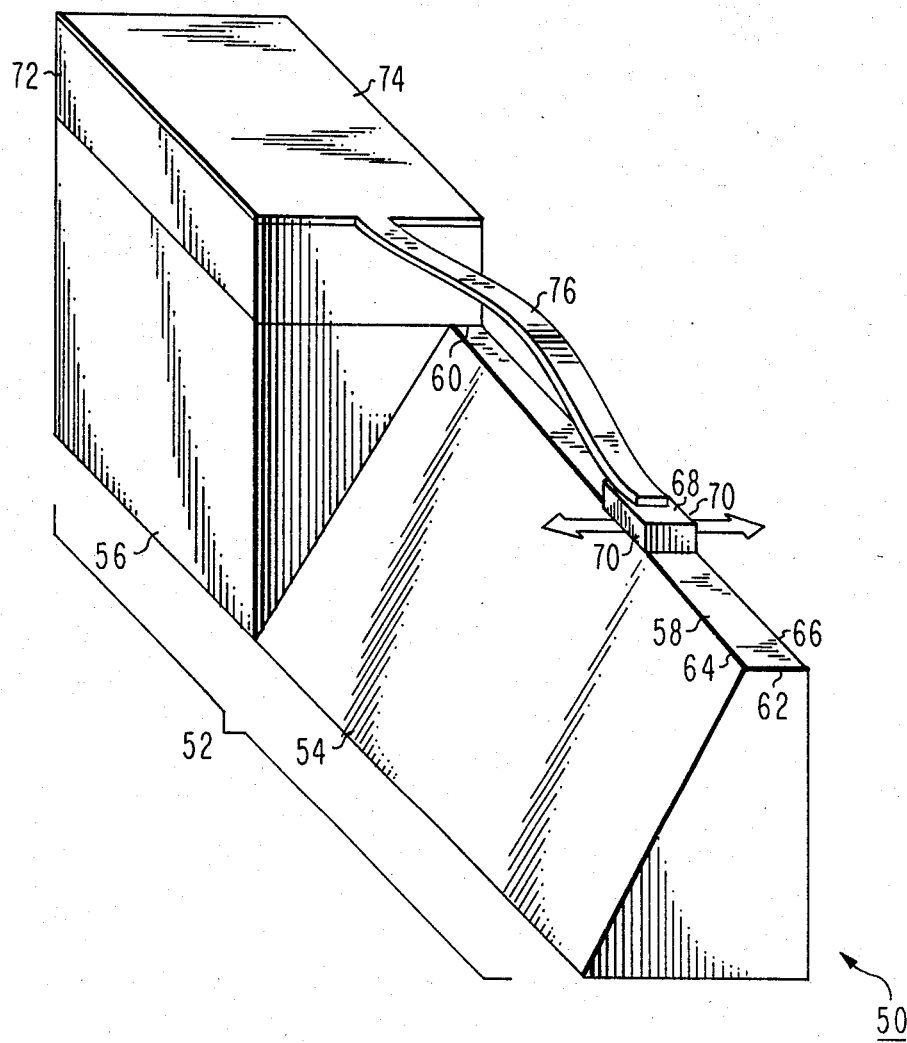

The side plane 30 includes a left surface 31, a right surface 32 and at least one inner plane 33 each arranged to receive printed wiring conductors for the purpose of providing signal paths between the connectors 21 through 29. Referring now to FIG. 4, printed wiring conductors 41 and 42 are formed on right external surface 32, and printed wiring conductors 43 and 44 are formed on internal plane 33. Signal paths are similarly formed on the left external surface 31 but have been omitted for purposes of clarity.

Paths for signals terminating external to the double file printed wiring board module are provided by a side plane connector 46 which is connected to printed wiring board connectors by means of printed wiring conductors. In this regard, the printed wiring board connector 21 is connected to the side plane connector 46 via printed wiring conductors 47. Although the printed wiring conductors 47 are shown formed on right side plane surface 32, they may be formed equally effectively on the left side plane surface 31 or the side plane inner plane 33. Attachment of the double file printed wiring board module of the present invention to terminations external to the double file printed wiring board module is advantageously accomplished by a cable 48 connected to the external termination connector 46 by a connector 49.

The present invention permits shorter wire lengths between adjacent printed wiring boards than is possible using known printed wiring board stacking techniques. In this regard and referring to FIG. 3, the printed wiring boards 2 and 3 illustrate a known printed wiring board stacking technique. The connector 21, connected to the printed wiring board 2, and the connector 23, connected to the printed wiring board 3, are each mounted on the left surface 31 of the side plane 30. The connectors 21 and 23 are spaced apart a predetermined minimum board distance to permit clearance between the printed wiring boards for components mounted thereon. The printed wiring conductors 41 and 43 (shown in FIG. 4) which connect the connectors 21 and 23 are thus of length greater than or equal to the distance between the connectors 21 and 23.

Alternately, the printed wiring boards 2, 5 and 3 illustrate the printed wiring board stacking technique of the present invention. In this regard, the connector 21, connected to the printed wiring board 2, is mounted on the left side plane surface 31 and the adjacent connector 22, connected to the printed wiring board 5, is mounted on the right side plane surface 32. The connector 23, connected to the printed wiring board 3, and adjacent to the connector 22, is again mounted on the left side plane 31. Here, the minimum board spacing requirement applies to the distance between the connectors 21 and 23 thereby permitting the adjacent connector 22 to be mounted closer to the connector 21 than would otherwise be allowed by the minimum board spacing requirement. This closer-than-the-minimum board spacing between adjacent connectors results in reduced wire lengths as may be seen by referring to FIG. 4 in which the printed wiring conductors 42 and 44 are shown shorter than the printed wiring conductors 41 and 43.

Referring now to FIG. 3, an additional benefit of the present invention is realized by positioning the printed wiring board connectors 21 through 29 and the printed wiring board guides 13 so as to incline the printed wiring boards of the left stack 1 and the right stack 4 at an angle to the horizontal. In such position, the printed wiring boards, the support plates 10 and 11, and the interconnect plane 30 cooperate to form a plurality of sloping ducts above each printed wiring board. In this regard, the side plane 30 cooperates with printed wiring boards 50 and 51 and the side plane 11 to form a sloping duct 52. Referring to FIG. 4, the sloping duct 52 includes a lower end generally indicated by 53 and an upper end generally indicated by 54. In operation, air enters the duct 52 at the lower end 53 and flows past the printed wiring board 52 by means of convection thus cooling circuitry mounted thereon. The air then exits through the higher duct end 54.

The present invention may include keyed printed wiring boards and connectors to aid in more accurately positioning the boards and connectors relative to each other. In this regard and referring to FIG. 1, the printed wiring board 5 is shown including keying notch 56 formed at the rear end of the inner edge 6, and the connector 22 is shown including a front edge 57 and a catch 58 formed in its body. In operation, the printed wiring board 5 is slid into the connector 22 via its front edge 57. As the printed wiring board 5 approaches its final engaged position, the connector catch 58 engages the printed wiring board keying notch 56 to position the printed wiring board 5 properly in relation to the connector 22.

Other benefits and advantages exist in the present invention. For example, support plates 10 and 11 may be formed of electrically conductive or magnetically conductive material to shield the printed wiring boards from stray electrical or magnetic interference. Alternately, the connectors 21 through 29 may be of the zero-insertion-force type to ease insertion of the printed wiring boards thereinto. Further, the double file printed wiring board module of the present invention may be positioned in a horizontal orientation.

In addition, the present invention may be arranged to mount printed wiring boards of two different widths. In this regard, the support plane positioners 12' may be provided of greater length than the support plate positioners 12 to thus position the support plate 10 at a greater distance from the side plane 30 than the support plane 11. When so arranged, the double file printed wiring board module of the present invention may mount printed wiring boards of a normal or usual width to the right of the side plane 30 and printed wiring boards of a wider than normal width to the left of the side plane 30.

It will now be apparent that a double file printed wiring board module of the present invention has been described hereinabove which offers significant advantages over prior art modules. The module, by virtue of mounting the connectors 21 through 29 on both sides of the side plane 30, permits the printed wiring boards to be connected using conductors of shorter lengths. Further, use of the positioners (12 and 12') of varying lengths permits mounting printed wiring boards of various widths.

The present invention has been described with reference to specific embodiments thereof for the purpose of illustrating the manner in which the invention may be used to advantage. It will be appreciated by those skilled in the art that numerous modifications of the present invention can be made without departing from the spirit of the invention which shall be limited only by the scope of the claims appended hereto.

What is claimed is:

1. A double file printed wiring board module comprising:

first and second columns of printed wiring boards, each column including at least one printed wiring board, each board including a component mounting surface, first and second edges, and a plurality of connector tabs adjacent to said first edge to provide access to said board, said board in said first column arranged parallel to said board in said second column without overlap in a direction normal to said component mounting surfaces, said connector tab edge of said board in said first column adjacent to said connector tab edge of said board in said second column;

a pair of support plates, each support plate positioned adjacent to a different one of said board second edges;

a plurality of positioners positioning said support plates relative to each other;

at least one pair of printed wiring board guides, each guide attached to a different one of said support plates and including at least one groove engaged with a corresponding one of said board second edges;

at least first and second interconnected connectors, each connector engaging said plurality of connector tabs of a different one of said printed wiring boards;

a side plane positioned relative to said support plates, positioned intermediate to said printed wiring boards, mounting said first connector on a first side thereof and said second connector on a second side thereof not opposite said first connector, said side plane via said connectors cooperating with said support plates via said board guides to support said printed wiring boards;

an inner plane formed in said side plane intermediate said first and said second side surfaces; and a plurality of printed wiring conductors formed on said first side surface, on said second surface and on said inner plane, said printed wiring conductors connected in a predetermined manner to said connectors to provide signal paths between said first and second interconnected connectors.

2. A double file printed wiring board module as claimed in claim 1, wherein: said positioners are attached to said side plane.

3. A double file printed wiring board module as claimed in claim 1, wherein: said side plane is vertically oriented.

4. A double file printed wiring board module as claimed in claim 3, wherein: said connectors are mounted to said side plane at an angle to the horizontal.

5. A double file printed wiring board module as claimed in claim 1, wherein: said support plates are electrically conductive.

6. A double file printed wiring board module as claimed in claim 1, wherein: said support plates are magnetically conductive.

7. A double file printed wiring board module as claimed in claim 1, wherein: said printed wiring board guides attached to each of said support plates are formed as a unitary structure.

8. A double file printed wiring board module as claimed in claim 2, wherein: said printed wiring boards are formed having at least first and second widths, said positioners are formed having at least first and second lengths, and said side plane is formed including at least first and second sides, said positioners of said first length attached to said side plane first side to position said first support plate at a first distance relative to said side plane to permit the positioning of said printed wiring boards of said first width between said first support plate and said side plane, and said positioners of said second length attached to said side plane second surface positioning said second support plate at a second distance relative to said side plane to permit positioning printed wiring boards of said second width between said second support plate and said side plane.

9. A double file printed wiring board module as claimed in claim 1, wherein: said side plane includes printed wiring conductors requiring connection to terminations external to said side plane and said module further includes at least one external connection connector attached to said side plane, said external termination conductors connected to said external terminations through said external termination connector.

10. A double file printed wiring board module as claimed in claim 1, wherein: said support plates are parallel to each other.

11. A double file printed wiring board module as claimed in claim 1, wherein: said side plane is parallel to said first support plate and in the alternative parallel to said second support plate.

12. A double file printed wiring board module as claimed in claim 1, wherein: said printed wiring boards are positioned perpendicular to said side plane.

13. A double file printed wiring board module as claimed in claim 1, wherein: said connectors each include first positioning means and said printed wiring boards each include second positioning means, said first and second positioning means engaged with each other to position each of said printed wiring boards in relation to a respective one of said connectors.

14. A double file printed wiring board module as claimed in claim 13, wherein: said first positioning means includes a catch and said second positioning means includes a notch.

* * * * *